(12) United States Patent
Racanelli

(10) Patent No.: US 6,475,849 B2
(45) Date of Patent: Nov. 5, 2002

(54) METHOD FOR REDUCING BASE RESISTANCE IN A BIPOLAR TRANSISTOR

(75) Inventor: Marco Racanelli, Orange, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/133,690

(22) Filed: Apr. 26, 2002

(65) Prior Publication Data

US 2002/0117733 A1 Aug. 29, 2002

Related U.S. Application Data

(62) Division of application No. 09/653,982, filed on Sep. 1, 2000.

(51) Int. Cl.[7] .......................................... H01L 21/8238
(52) U.S. Cl. ....................... 438/202; 438/322; 438/357; 438/309
(58) Field of Search .......................... 438/202; 257/591, 257/203, 322

(56) References Cited

U.S. PATENT DOCUMENTS 5,581,115 A * 12/1996 Grubisich et al. .......... 257/592
5,589,409 A * 12/1996 Bulucea et al. ............. 438/377
6,221,783 B1 * 4/2001 Park et al. .................. 438/712

* cited by examiner

Primary Examiner—David Nelms
Assistant Examiner—Thao P Le
(74) Attorney, Agent, or Firm—Farjami & Farjami LLP

(57) ABSTRACT

According to a disclosed method, a dopant spike region is formed in a link base region, which connects an intrinsic base region to an extrinsic base region. For example, the intrinsic base region can be the region in which the base-emitter junction is formed in a silicon-germanium hetero-junction bipolar transistor, and the extrinsic base region can be the external portion of the base of the same transistor to which external electrical contact is made. The dopant spike can be an increased concentration of boron dopant. A diffusion blocking segment is then fabricated on top of the link base region in order to prevent diffusion of the dopant spike out of the link base region. For example, the diffusion blocking segment can be formed from silicon-oxide. Thus, link base resistance is reduced, for example, by the higher concentration of boron dopant in the dopant spike region causing the link base resistance to be lower than the intrinsic base resistance. Moreover, a structure comprising a base region with reduced link base resistance can be fabricated according to the disclosed method.

25 Claims, 4 Drawing Sheets

METHOD FOR REDUCING BASE RESISTANCE IN A BIPOLAR TRANSISTOR

This is a divisional of application Ser. No. 09/653,982 filed Sep. 1, 2000.

BACKGROUND OF THE INVENTION

1. Field of the Invention

The present invention relates to the field of fabrication of semiconductor devices. More specifically, the invention relates to the fabrication of epitaxial base bipolar semiconductor devices.

2. Background Art

In an epitaxial base bipolar transistor, a thin layer of silicon, or silicon-germanium, is grown as the base of a bipolar transistor on a silicon wafer. The epitaxial base bipolar transistor has significant advantages in speed, frequency response, and gain when compared to a conventional implanted base silicon bipolar transistor. Speed and frequency response can be compared by the cutoff frequency which, simply stated, is the frequency where the gain of a transistor is drastically reduced. More technically, the current gain approaches a value of one as the frequency of operation of the transistor approaches the cutoff frequency. Cutoff frequencies in excess of 100 GHz have been achieved for silicon-germanium epitaxial base bipolar transistors, which are comparable to those achieved in more expensive GaAs devices. Previously, implanted base silicon bipolar transistors have not been competitive for use where very high speed and frequency response are required.

The higher gain, speeds, and frequency response of the epitaxial base bipolar transistor have been achieved as a result of certain advantages not possible in implanted base silicon bipolar transistors, in particular, the ability to incorporate silicon-germanium layers to form a heterojunction bipolar transistor ("HBT"). Silicon-germanium may be epitaxially grown on silicon wafers using conventional silicon processing and tools, and allows one to engineer device properties such as the band gap, energy band structure, and mobilities. For example, it is known in the art that grading the concentration of germanium in the silicon-germanium base builds into the HBT device an electric field, which accelerates the carriers across the base, thereby increasing the speed of the HBT device compared to a silicon-only device. One method for fabricating silicon and silicon-germanium devices is by chemical vapor deposition ("CVD"). A reduced pressure chemical vapor deposition technique, or RPCVD, used to fabricate the HBT device allows for a controlled grading of germanium concentration across the base layer. As already noted, speeds in the range of approximately 100 GHz have been demonstrated for silicon-germanium devices, such as the HBT.

Because the benefits of a high gain and high speed silicon-germanium HBT device can be either partially or completely negated by a high base contact resistance, it is important that the resistance of the base contact be kept low. In addition to providing low resistance in the base contact, the geometry of the base region may necessitate providing a low resistance electrical pathway through a portion of the base itself between the base contact and the base-emitter junction. In order to provide lower resistance from the base contact to the base-emitter junction, the extrinsic base region is heavily doped by implantation (or extrinsic doping). The heavily doped extrinsic base region has a reduced resistance. The region in the base between the edge of the heavily doped extrinsic base region and the edge of the base-emitter junction is referred to as the link base region. The link base region adds a significant amount of resistance between the base contact and the base-emitter junction. It is, therefore, important for the reasons stated above that resistance of the link region also be kept low. The resistance of the link base region is affected by the distance across the link base region from the heavily doped extrinsic base region to the edge of the base-emitter junction. Since the base-emitter junction is substantially coterminous with an "intrinsic base region," the link base region spans a distance between the intrinsic base region and the extrinsic base region. In other words, the link base region "links" the extrinsic base region to the intrinsic base region. The distance across the link base region from the heavily doped extrinsic base region to the intrinsic base region must be no smaller than a certain minimum separation distance in order to provide separation between the heavily doped region of the extrinsic base and the heavily doped region of the emitter near the base-emitter junction.

The link base region itself is relatively lightly doped. If the separation between the heavily doped region of the extrinsic base and the heavily doped region of the emitter near the base-emitter junction is not greater than a minimum separation distance, the two heavily doped regions can form a high field junction and increase the leakage current between the emitter and the base, thereby degrading the performance characteristics of the HBT device. Depending on the alignment of the sequence of steps in the fabrication process used to form the intrinsic base region, to form the base-emitter junction, and to implant the heavily doped extrinsic base region, the distance across the link base region to the intrinsic base region can vary, often unpredictably. With perfect alignment of the sequence of steps in the fabrication process, the distance across the link base region can be minimized to the minimum separation distance just discussed. In that case, the link base resistance would also be minimized. Accounting for the misalignment of the sequence of steps in the fabrication process, however, forces the fabrication of a much greater distance across the link base region than the minimum separation distance. Thus, the link base resistance is greater than the minimum possible link base resistance.

It is important to provide a low resistance in the base contact, the heavily doped extrinsic base region, and the link base region in order to allow the formation of an optimum low-resistance conduction path from the base contact to the intrinsic base region of the HBT or other similar device such as a conventional bipolar transistor. Because the resistances of the base contact, the heavily doped extrinsic base region, and the link base region are in series, the reduction of any one of them will provide an improvement in the resistance of the conduction path from the base contact to the base of the HBT or other similar device.

Thus, there is need in the art to reduce the link base resistance. There is further need in the art to reduce the link base resistance without regard to the alignment of the sequence of steps in the fabrication process. There is also need in the art to reduce the link base resistance without creating additional steps in the sequence of steps in the fabrication process.

SUMMARY OF THE INVENTION

The present invention is directed to method for reducing base resistance and related structure. The invention overcomes the need in the art to reduce the link base resistance. The invention also reduces the link base resistance without regard to the alignment of the sequence of steps in the fabrication process. Further, the invention reduces the link base resistance without creating additional steps in the fabrication process.

According to the invention, a dopant spike region is formed in a link base region, which connects an intrinsic base region to an extrinsic base region. For example, the intrinsic base region can be the region in which the base-emitter junction is formed in a silicon-germanium heterojunction bipolar transistor, and the extrinsic base region can be the external portion of the base of the same transistor to which external electrical contact is made. The dopant spike can be an increased concentration of boron dopant.

A diffusion blocking segment is then fabricated on top of the link base region in order to prevent diffusion of the dopant spike out of the link base region. For example, the diffusion blocking segment can be formed from silicon-oxide. Thus, link base resistance is reduced, for example, by the higher concentration of boron dopant in the dopant spike region causing the link base resistance to be lower than the intrinsic base resistance. Moreover, a structure comprising a base region with reduced link base resistance can be fabricated according to the method of the present invention.

DETAILED DESCRIPTION OF THE INVENTION

The present invention is directed to a method for reducing base resistance and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
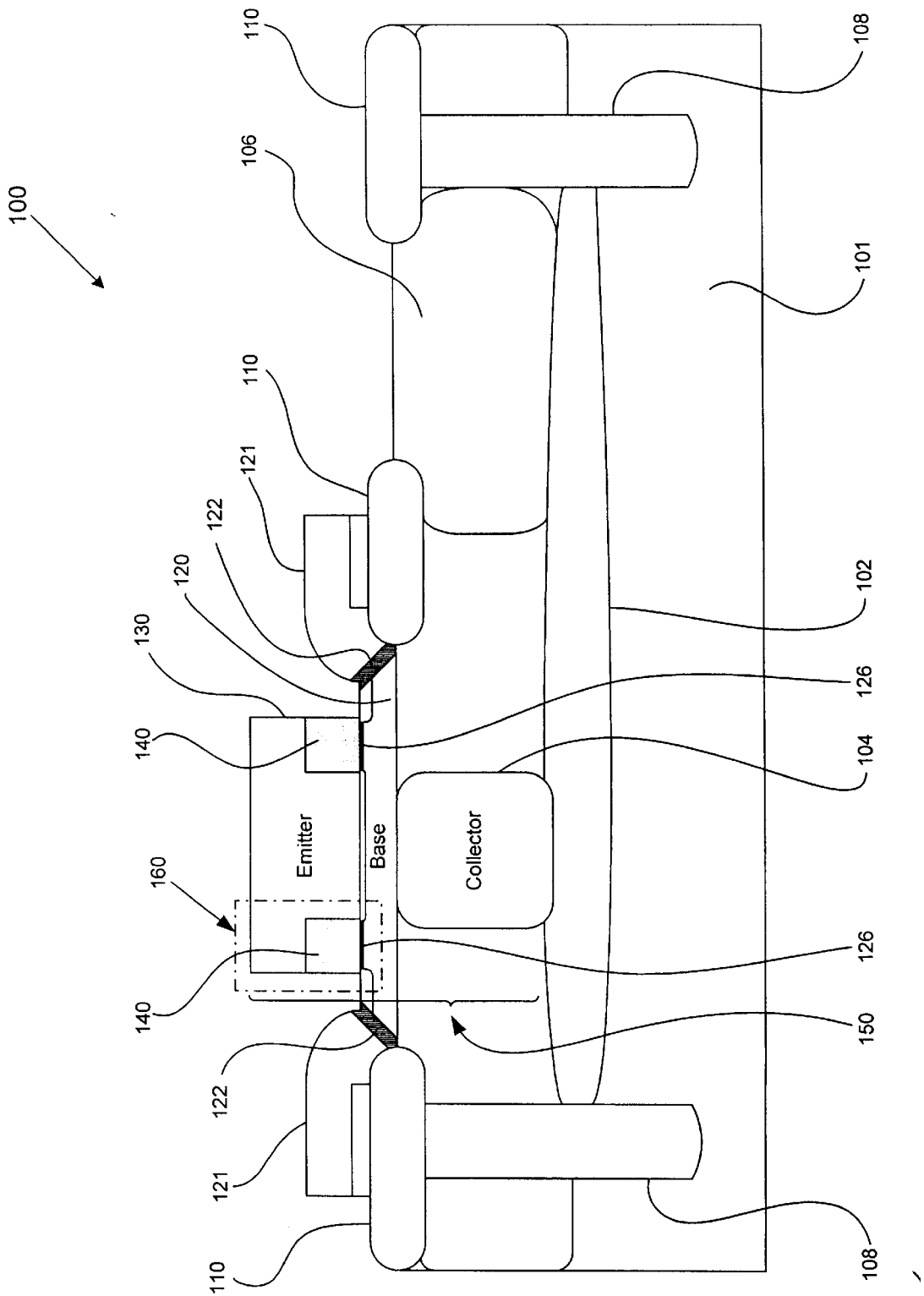
FIG. 1 illustrates a cross sectional view of some of the features of an NPN HBT fabricated in accordance with one embodiment of the present invention.

FIG. 1 shows a cross sectional view of various features and components of structure 100 which includes various features and components of an embodiment of the invention as described below. Certain details and features have been left out which are apparent to a person of ordinary skill in the art. Structure 100 includes collector 104, base 120, and emitter 130. Collector 104 is N-type single crystal silicon which can be deposited epitaxially using an RPCVD process in a manner known in the art. Base 120 is P-type silicon-germanium single crystal deposited epitaxially in a "nonselective" RPCVD process. As seen in FIG. 1, base 120 is situated on top of, and forms a junction with, collector 104. Base contact 121 is polycrystalline silicon-germanium deposited epitaxially in a "nonselective" RPCVD process. Base 120 and base contact 121 connect with each other at interface 122 between the contact polycrystalline material and the base single crystal material. Emitter 130, which is situated above and forms a junction with base 120, is comprised of N-type polycrystalline silicon. Collector 104, base 120, and emitter 130 thus form a heterojunction bipolar transistor ("HBT") which is generally referred to by numeral 150 in FIG. 1.

As seen in FIG. 1, buried layer 102, which is composed of N+ type material—meaning that it is relatively heavily doped N-type material—is formed in silicon substrate 101 in a manner known in the art. Collector sinker 106, also composed of N+ type material, is formed by diffusion of heavily concentrated dopants from the surface of collector sinker 106 down to buried layer 102. Buried layer 102, along with collector sinker 106, provide a low resistance electrical pathway from collector 104 through buried layer 102 and collector sinker 106 to a collector contact (the collector contact is not shown in any of the Figures). Deep trench 108 structures and field oxide 110 structures composed of silicon oxide ($SiO_2$) material are formed in a manner known in the art. Deep trench 108 and field oxide 110 structures provide electrical isolation from other devices on silicon substrate 101 in a manner known in the art.

Dielectric segments 140, which can be composed of silicon oxide, provide electrical isolation to emitter 130 from base 120. Dielectric segments 140 are also referred to as "diffusion blocking segments" in the present application. Dielectric segments 140 also maintain the concentration of boron spike region 126 according to one embodiment of the invention as further described below. Boron spike region 126 is also referred to as "dopant spike region" in the present application. The region enclosed by dashed line 160 is illustrated in detail as structure 460 in FIG. 4, which is discussed further in relation to FIG. 4.

By way of background, characteristics and functionality of HBT 150 are affected and can be tailored by varying the steps of the fabrication process. One useful tool for controlling the resultant performance characteristics of HBT 150 is the dopant and silicon-germanium profile. It is desirable to accurately control the dopant and silicon-germanium profile of HBT 150 to achieve a desired HBT performance.

Figure 2:
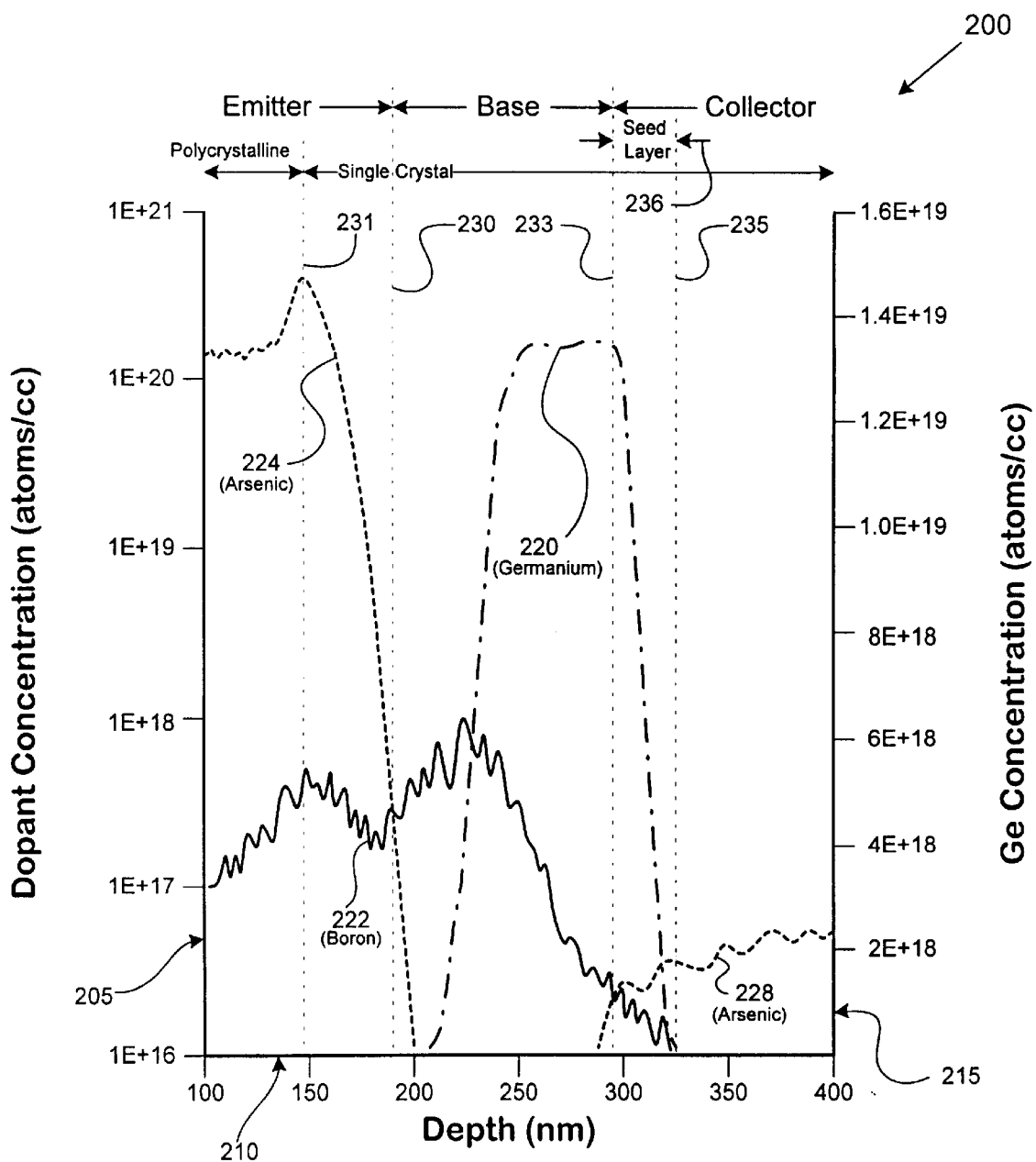
FIG. 2 illustrates the relative concentrations of dopants and germanium as a function of depth after completion of fabrication of an NPN HBT in accordance with one embodiment of the present invention.
Figure 3:
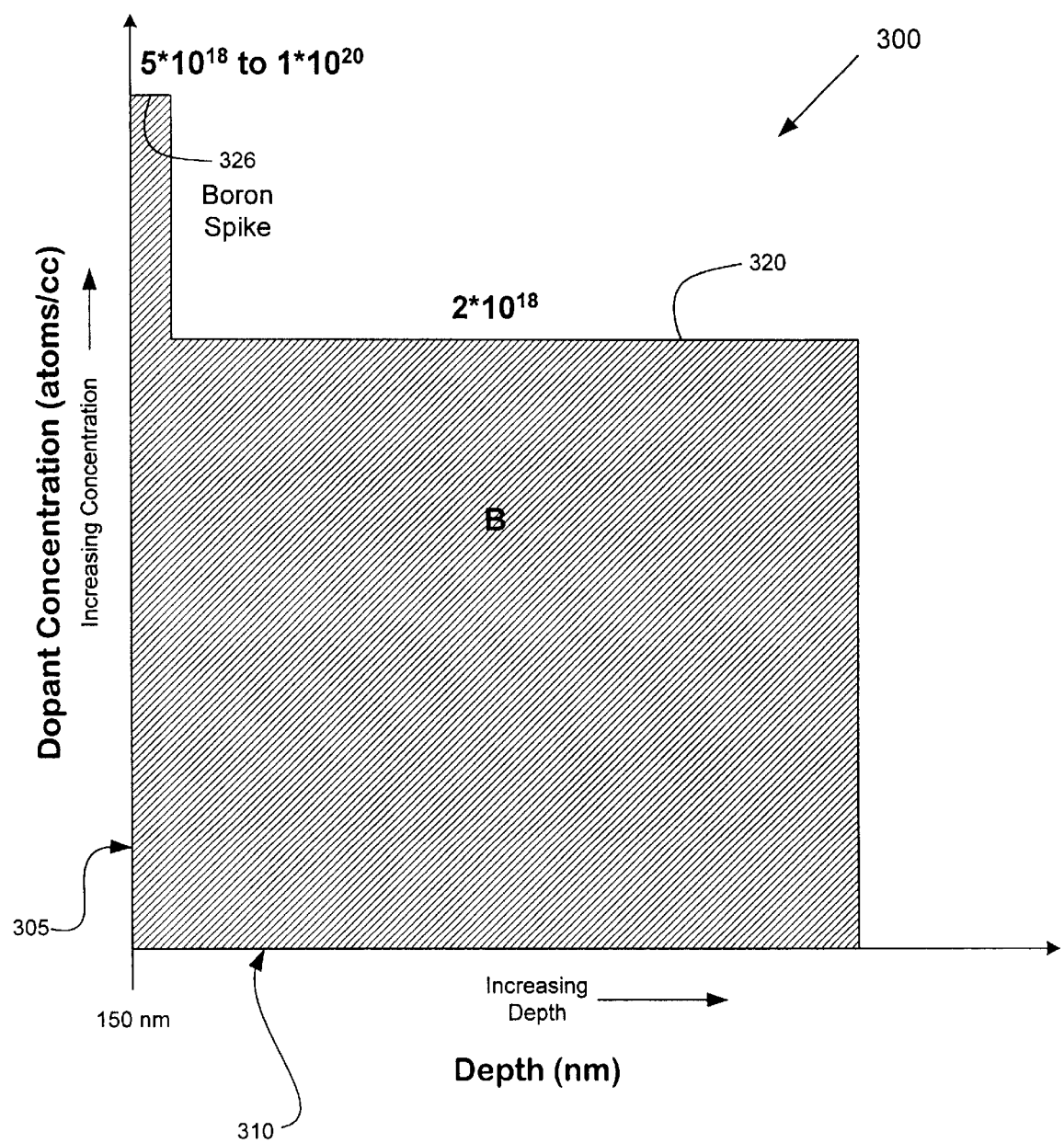
FIG. 3 illustrates the concentration of the boron spike region in an NPN HBT in accordance with one embodiment of the present invention.
Figure 4:
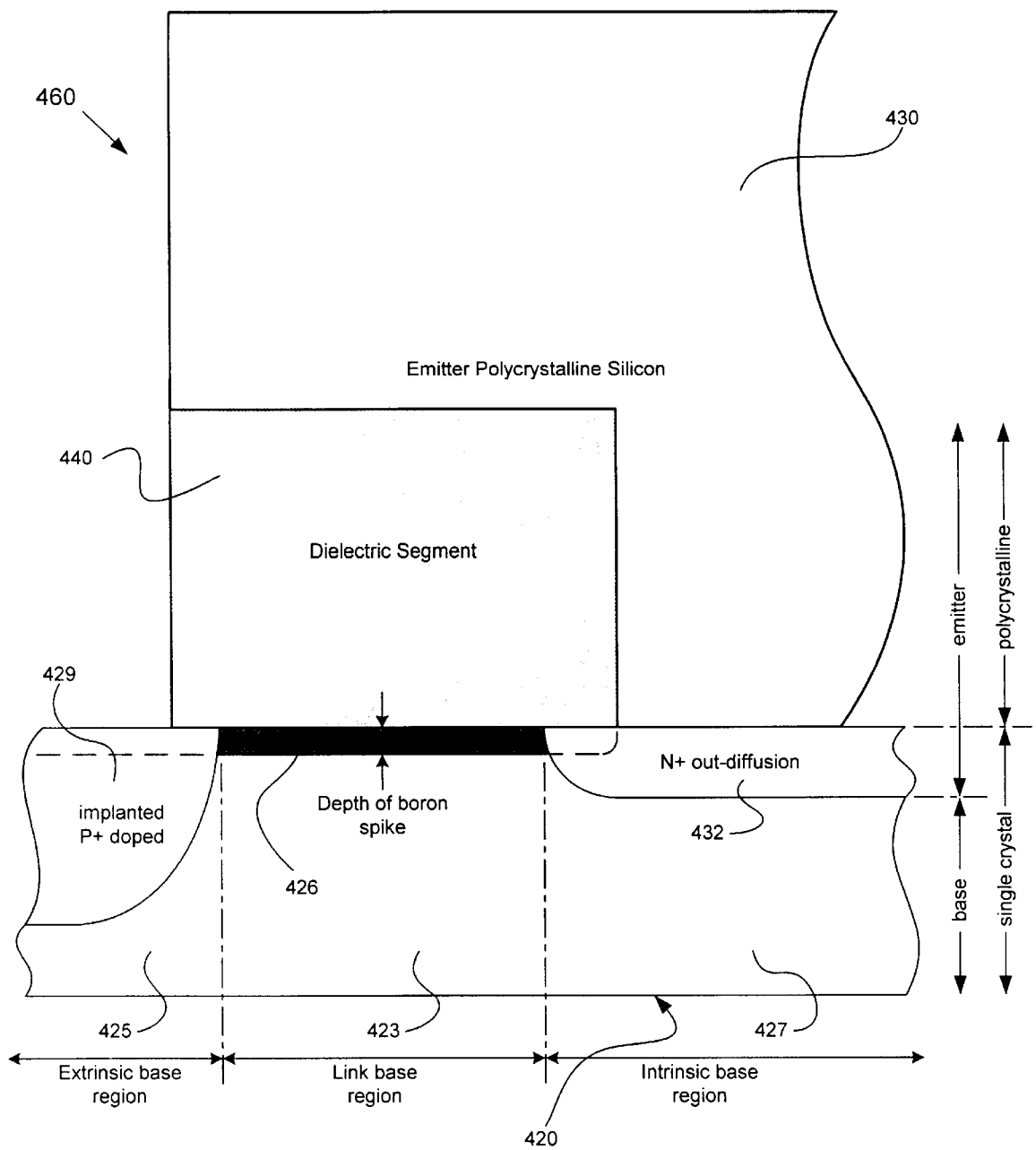
FIG. 4 illustrates in greater detail a portion of the cross sectional view of FIG. 1, and shows a cross sectional view of some of the features of an NPN HBT fabricated in accordance with one embodiment of the present invention.

Graph 200 in FIG. 2 depicts dopant concentration profile and germanium concentration profile prior to introducing a "boron spike" which, as described in more detail in relation to FIGS. 3 and 4, reduces the link base resistance. FIG. 2 shows graph 200 having dopant concentration axis 205, in atoms per cubic centimeter. Graph 200 also shows separate germanium concentration axis 215, in atoms per cubic centimeter. Both dopant concentration axis 205 and germanium concentration axis 215 are plotted against depth axis 210, measured in nanometers of depth from the top surface of HBT 150. As seen in graph 200 of FIG. 2, down to depth of approximately 190.0 nanometers corresponds to emitter 130 of HBT 150. This depth, i.e. the depth corresponding to emitter 130, is marked by dashed line 230 in graph 200 to indicate that the area between dashed line 230 and dopant concentration axis 205 corresponds to emitter 130 in FIG. 1.

Additionally, as seen in graph 200 of FIG. 2, down to depth of approximately 150.0 nanometers corresponds to polycrystalline silicon portion of emitter 130 of HBT 150. This depth, i.e. the depth corresponding to emitter polycrystalline silicon 130, is marked by dashed line 231 in graph 200 to indicate that the area between dashed line 231 and dopant concentration axis 205 corresponds to emitter polycrystalline silicon 130.

Also, as seen in graph 200 of FIG. 2, from depth of approximately 190.0 nanometers down to depth of approximately 295.0 nanometers corresponds to the base of HBT 150. This base was shown as base 120 in HBT 150 in FIG. 1. This depth, i.e. the depth corresponding to base 120, is marked by dashed line 230 and by dashed line 233 to indicate that the area between dashed line 230 and dashed line 233 corresponds to base 120 in FIG. 1.

Further, as seen in graph 200 of FIG. 2, from depth of approximately 295.0 nanometers downward corresponds to the collector of HBT 150. The collector was shown as collector 104 in HBT 150 in FIG. 1. This depth, i.e. the depth corresponding to collector 104, is marked by dashed line 233 to indicate that the area between dashed line 233 and germanium concentration axis 215 corresponds to collector 104 in FIG. 1.

Also, as seen in graph 200 of FIG. 2, from depth of approximately 295.0 nanometers down to depth of approximately 325.0 nanometers corresponds to silicon seed layer 236, discussed in more detail below, in the collector of HBT 150. For simplicity, this silicon seed layer is not shown in FIG. 1. The depth corresponding to silicon seed layer 236 is marked by dashed line 233 and by dashed line 235 and by the words "seed layer" to indicate that the area between dashed line 233 and dashed line 235 corresponds to silicon seed layer 236.

Germanium concentration curve 220 represents the concentration profile for germanium, and corresponds to germanium concentration axis 215. Boron concentration curve 222 represents the concentration profile for boron, and corresponds to dopant concentration axis 205. Arsenic concentration curve 224 represents the concentration profile for arsenic, and also corresponds to dopant concentration axis 205. A second arsenic concentration curve 228 also represents the concentration profile for arsenic, and also corresponds to dopant concentration axis 205.

By understanding characteristic growth rates for silicon and silicon-germanium according to temperature, pressure, flow rate, and the effect of doping and dopants, as well as the effect of strain resulting from the epitaxial growth of silicon-germanium on top of silicon due to the difference between the two materials, the process of achieving the desired pre-determined profile can be controlled in order to produce a multilayer collector-base-emitter stack with the desired profile.

Referring to FIG. 1, the portion of multilayer stack structure comprising collector 104, base 120, and emitter 130 is formed as a result of several processes. Collector 104 can be formed by epitaxial deposition of silicon over silicon buried layer 102. Formation of collector 104 includes arsenic doping which results in an N-type layer. Formation of collector 104 can include additional arsenic or phosphorous implant doping to further raise the dopant concentration of collector 104 to typical levels between $1*10^{16}$ per cubic centimeter and $5*10^{17}$ per cubic centimeter. As stated above, the collector region is shown in graph 200 as the region confined between dashed line 233 and germanium concentration axis 215. By referring to dopant concentration axis 205 and arsenic concentration curve 228 in graph 200 it is seen that arsenic atoms have a concentration of approximately $5*10^{16}$ atoms per cubic centimeter in the collector region. It is also seen in graph 200 that boron atoms have a negligible concentration in the collector region. Accordingly, collector 104 is an "N-type" single crystal silicon.

Silicon seed layer 236 is formed in the region near the top of collector 104 to maintain good crystallinity to aid growth of silicon-germanium above collector 104. Silicon-germanium, which will form part of base 120, is grown by epitaxy on top of the silicon seed layer. The concentration of germanium in the silicon-germanium layer comprising base 120 is graded by depth in the layer. As stated above, silicon seed layer 236 is shown in graph 200 as the region confined between dashed line 233 and dashed line 235. For simplicity, silicon seed layer 236 is not shown in structure 100 of FIG. 1.

As stated above, base region is shown in graph 200 as the region confined between dashed line 230 and dashed line 233. Thus, in the present embodiment, the base region covers a depth of approximately 190.0 nanometers down to approximately 295.0 nanometers. By referring to dopant concentration axis 205 and arsenic concentration curve 224 in graph 200 it is seen that arsenic atoms have a negligible concentration below approximately $5*10^{17}$ atoms per cubic centimeter in the base region. By referring to dopant concentration axis 205 and boron concentration curve 222, it is also seen that boron atoms have a concentration ranging from approximately $1*10^{16}$ to $1*10^{18}$ atoms per cubic centimeter. This concentration of boron atoms renders base 120, which is confined to a depth of approximately 190.0 nanometers to a depth of approximately 295.0 nanometers, a "P-type" base.

Dashed line 230 in graph 200, which marks the upper end of base 120 at a depth of approximately 190.0 nanometers in HBT 150, also corresponds to the emitter-base junction of HBT 150. A single crystal "silicon cap" occupies the region from slightly below the emitter-base junction, which is at a depth of approximately 190.0 nanometers, to a depth of approximately 150.0 nanometers indicated by dashed line 231 in graph 200, which is inside the emitter region.

The emitter region is shown in graph 200 as the region confined between dashed line 230 and dopant concentration axis 205. Thus, in the present embodiment, the emitter region covers a depth of approximately 100.0 nanometers down to approximately 190.0 nanometers. It is seen from arsenic concentration curve 224 in graph 200 that arsenic atoms have a concentration ranging from approximately $5*10^{17}$ to approximately $5*10^{20}$ atoms per cubic centimeter in emitter 130 of HBT 150. It is also seen from boron concentration curve 220 in graph 200 that boron atoms have a concentration ranging from approximately $1*10^{17}$ to $5*10^{17}$ atoms per cubic centimeter. This concentration of boron atoms in the emitter is much smaller than the concentration of arsenic atoms in the emitter. As such, the emitter region is an "N-type" region. The base-emitter junction, identified by dashed line 230 in graph 200, occurs just above the lower end of the single crystal silicon cap. As stated above, the single crystal silicon cap, which includes the base-emitter junction, spans from a depth slightly below dashed line 230 and up to dashed line 231.

By way of background, during a chemical vapor deposition ("CVD") process used for epitaxially growing silicon, a gas containing a precursor for silicon flows across the silicon surface. For CVD processes, hydrides are usually used as these precursors. For example, for silicon the precursor is $SiH_4$. The precursor, such as $SiH_4$, is subjected to high temperatures. The precursor molecule, in this example $SiH_4$, usually attaches to an available silicon site. The silicon-hydrogen bond of the precursor hydride, at high enough temperature, will break apart. So given enough heat energy the hydrogen-silicon bonds break, the hydrogen is desorbed, and the silicon stays behind. Doping of the epitaxial growth is achieved by adding a precursor for dopant to the gas flow across the silicon surface during the deposition process. For CVD processes, hydrides are also usually used as these precursors. For example, for boron the precursor is $B_2H_6$. The dopants become incorporated into the growing silicon when the hydrogen is desorbed. In one embodiment of the invention precursors containing germanium, for example $GeH_4$, as well as precursors containing silicon, for example $SiH_4$, and precursors containing boron, for example $B_2H_6$, are used to grow an epitaxial silicon-germanium P-type crystal in base 120 of the HBT 150.

FIG. 3 shows graph 300 having dopant concentration axis 305, in atoms per cubic centimeter. Dopant concentration axis 305 is plotted against depth axis 310, measured in nanometers of depth from the top surface of the single crystal silicon cap of HBT 150, i.e. from a depth of approximately 150.0 nanometers as shown in FIG. 3. As seen in graph 300 of FIG. 3, the concentration of boron dopant during the epitaxial deposition of silicon and silicon-germanium is held constant from the maximum depth here boron dopant is added almost to the top surface of the single crystal silicon cap. his concentration, i.e. the constant level of boron, is marked by horizontal line 320 in graph 300 to indicate that portion of the deposition process where the concentration of boron is held constant. As indicated on graph 300, a typical value for the constant boron concentration is $2*10^{18}$ atoms per cubic centimeter. The value may vary, however, in a range from approximately $1*10^{18}$ to approximately $5*10^{19}$ atoms per cubic centimeter.

Also as seen in graph 300 of FIG. 3, the concentration of boron dopant during the epitaxial deposition of silicon and silicon-germanium is sharply increased in the region just below the top surface of the single crystal silicon cap to the top surface of the single crystal silicon cap. This concentration, i.e. the sharply increased concentration of boron, is marked by horizontal line 326 in graph 300 to indicate that portion of the deposition process where the concentration of boron is sharply increased. The sharply increased concentration of boron just below the top surface of the single crystal silicon cap up to the top surface of the single crystal silicon cap is referred to as "boron spike." As shown in FIG. 3, the boron spike region occupies a depth of approximately 150.0 nanometers. It is noted again, that graph 200 in FIG. 2 illustrated the boron concentration prior to the introduction of the boron spike shown in FIG. 3. As such, boron concentration curve 222 did not depict the boron spike shown in FIG. 3.

As indicated by graph 300, the value for boron concentration in the boron spike region is approximately $5*10^{18}$ to approximately $1*10^{20}$ atoms per cubic centimeter, according to one embodiment of the present invention. Thus, in an embodiment where the boron concentration level marked by line 320 is approximately $2*10^{18}$, the ratio of the boron concentration inside the boron spike region to the boron concentration outside the boron spike region indicated by line 320 can be as high as 50.0. It is noted that prior to the present invention, the process of boron doping in the fabrication of HBT 150 did not include the formation of boron spike just below the top surface of the single crystal silicon cap. Boron concentration curve 222 in FIG. 2 shows concentration profile for boron resulting from the previous process, i.e. the process prior to the present invention.

Almost all of the sharply increased concentration of boron in the "intrinsic base region" of base 120 (the intrinsic base region is discussed in more detail in relation to FIG. 4 below) diffuses out into emitter polycrystalline silicon 130 which covers a portion of the top surface of the single crystal silicon cap, and almost none of the sharply increased concentration of boron diffuses back into the single crystal region in the emitter area or the base-emitter junction area of the silicon cap or the intrinsic base region. Thus, in the single crystal region in the emitter and base-emitter junction area of the silicon cap and the intrinsic base region of base 120, boron spike effectively disappears through the process of diffusion into emitter polycrystalline silicon 130. Thus, the formation of boron spike has no substantial effect on the dopant profile in the emitter and emitter-base junction area of the silicon cap or in intrinsic base region of base 120 of HBT 150. A substantial increase of boron concentration in the boron profile in the emitter-base junction area of the silicon cap or in intrinsic base region of base 120 of HBT 150 could, for example, have the undesirable effect of reducing the gain and the cutoff frequency of HBT 150.

FIG. 4 shows a more detailed cross sectional view of selected features and components of structure 100 of FIG. 1. In particular, portions of emitter 130, base 120, and dielectric segments 140 enclosed by dashed line 160 in FIG. 1 are shown respectively as emitter 430, base 420, and dielectric segment 440 in structure 460 in FIG. 4. FIG. 4 shows emitter 430 and "out-diffusion area" 432 formed by the out-diffusion of N+ dopants from the polycrystalline silicon emitter 430 into the single crystal layer therebelow. As seen in FIG. 4, emitter 430 is situated above the N+ out-diffusion area.

As seen in FIG. 4, dielectric segment 440 is situated above single crystal link base region 423. In one embodiment, dielectric segment 440 can be silicon oxide. Single crystal N+ out-diffusion area 432 is situated above single crystal intrinsic base region 427. Extrinsic base region 425, link base region 423, and intrinsic base region 427 comprise base 420. The base-emitter junction is formed within the single crystal layer at the boundary of N+ out-diffusion area 432 and intrinsic base region 427.

Continuing with FIG. 4, N+ out-diffusion area 432 of the single crystal layer is formed by out-diffusion of heavy concentration of arsenic dopants after ion implantation doping of emitter polycrystalline silicon 430. The N+ doping renders emitter 430 an N-type emitter. Ion implantation of extrinsic base region 425 has resulted in the heavily doped P+ implanted region 429 within extrinsic base region 425. In one embodiment, the dopant used to form implanted region 429 can be boron. The heavy doping in implanted region 429 lowers the overall resistance of extrinsic base region 425. The overall base resistance of HBT 150 is thereby improved by lowering the contribution of extrinsic base region 425 to the series resistance of the path from the base contact, through the base contact, heavily doped extrinsic base region 425, and link base region 423 to intrinsic base region 427.

Continuing with FIG. 4, boron spike region 426, which corresponds to boron spike region 126 of FIG. 1, is formed according to one embodiment of the present invention as follows. Initially a boron spike, whose dopant concentration is represented in FIG. 3 by horizontal line 326 in graph 300, occurs over the entire top surface of single crystal silicon cap, only a portion of which is covered by emitter polycrystalline silicon 430. Another portion of the top surface of single crystal silicon cap is covered by dielectric segment 440. Almost none of the sharply increased concentration of boron diffuses out of the silicon cap from the top surface of link base region 423. This is in contrast to the top surface of intrinsic base region 427 where emitter 430, instead of dielectric segment 440, covers the top surface of the single crystal silicon cap. The boron spike diffuses out from the top surface of intrinsic base region 427 into emitter 430. As such, the boron spike region 426 is confined to base link region 423 as shown in FIG. 4.

The boron spike remains near the top surface of the single crystal silicon cap forming boron spike region 426 in the areas covered by the dielectric segments 440, which coincide with the link base region 423 of base 420. Thus, boron spike region 426 is formed in link base region 423, but not in intrinsic base region 427.

Without boron spike region 426, link base region 423 is a relatively lightly doped P-type crystal with boron concentration profile similar to that of intrinsic base region 427. The addition of boron spike region 426 to link base region 423, increases the P-type doping of a portion of link base region 423, thereby lowering the overall resistance of link base region 423. The overall resistance of link base region 423 is also referred to as "link base resistance" in this application. The overall resistance of intrinsic base region 427, or "intrinsic base resistance," is not affected. The lower link base resistance improves the overall base resistance by lowering the link base region 423 contribution to the series resistance of the path from the base contact through extrinsic base region 425 and link base region 423 to intrinsic base region 427.

The effect of boron spike region 426 on link base resistance is in proportion to the ratio of the concentration of boron in boron spike region 426 to the constant boron concentration in link base region 423, as discussed above. Thus, according to one embodiment of the present invention the link base resistance is reduced by a factor of as much as 50 times. In units of ohm-microns, and depending on the actual device, the previous typical values for link base resistance translate to a range of approximately 1,000.0 ohm-microns. According to one embodiment of the present invention, typical values for link base resistance are reduced to values as low as approximately 20.0 ohm-microns.

The lowered resistance of link base region 423 reduces the need, discussed above, to minimize the distance across the link base region to the intrinsic base region which required perfect alignment of the sequence of steps in the fabrication process used to form the intrinsic base region, to form the base-emitter junction, and to form a heavily implanted region of the extrinsic base region. Efforts to improve the alignment of the sequence of steps in the fabrication process have involved additional steps in the fabrication process. The additional steps incur additional costs in terms of decreased throughput of the overall fabrication process. One advantage of an embodiment of the present invention described here is that boron spike area 426 does not involve the addition of any extra process steps. Thus, one embodiment of the present invention improves base resistance and maintains high throughput of the fabrication process.

It is appreciated by the above detailed disclosure that the invention provides a method for reducing base resistance and related structure. Using the invention, base resistance in an HBT can be controlled and reduced. Although the invention is described as applied to the construction of a heterojunction bipolar transistor, it will be readily apparent to a person of ordinary skill in the art how to apply the invention in similar situations where control is needed to reduce base resistance without affecting the profile of the epitaxial single crystal intrinsic base.

From the above description of the invention it is manifest that various techniques can be used for implementing the concepts of the present invention without departing from its scope. For example, although the CVD process used in the particular embodiment of the present invention described here is the reduced pressure, or RPCVD, other types of CVD techniques known in the art could be used without departing from the scope of the present invention. Moreover, while the invention has been described with specific reference to certain embodiments, a person of ordinary skills in the art would recognize that changes can be made in form and detail without departing from the spirit and the scope of the invention. For example, although dielectric segments 140 used as diffusion blocking segments can, in one embodiment, be silicon oxide, they can also be comprised of one or more of additional or different types of dielectrics. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a method for reducing base resistance and related structure have been described.

What is claimed is:

1. A method comprising steps of:
    forming a dopant spike region in a link base region, said link base region connecting an intrinsic base region to an extrinsic base region, said link base region having a link base resistance, said intrinsic base region having an intrinsic base resistance;
    fabricating, on top of said link base region, a diffusion blocking segment;
    said dopant spike region causing said link base resistance to be lower than said intrinsic base resistance.

2. The method of claim 1 further comprising a step of fabricating an emitter on top of said intrinsic base region after said step of fabricating a diffusion blocking segment.

3. The method of claim 1 wherein said diffusion blocking segment is an oxide segment.

4. The method of claim 2 wherein said emitter comprises polycrystalline silicon.

5. The method of claim 1 wherein said dopant spike region comprises boron.

6. The method of claim 1 wherein said dopant spike region comprises boron at a concentration of between $5*10^{18}$ and $1*10^{20}$ atoms per cubic centimeter.

7. The method of claim 1 wherein said diffusion blocking segment prevents diffusion of said dopant spike region out of said link base region.

8. The method of claim 2 wherein said emitter permits diffusion of said dopant spike region out of said intrinsic base region.

9. The method of claim 1 wherein said link base resistance is approximately 20.0 ohm-microns.

10. The method of claim 1 wherein a base in a silicon-germanium heterojunction bipolar transistor comprises said link base region, said extrinsic base region, and said intrinsic base region.

11. The method of claim 1 wherein a base in an epitaxial base bipolar transistor comprises said link base region, said extrinsic base region, and said intrinsic base region.

12. A method comprising steps of:

forming a dopant spike region in a link base region of a base, said link base region connecting an intrinsic base region of said base to an extrinsic base region of said base, said link base region having a link base resistance, said intrinsic base region having an intrinsic base resistance;

said dopant spike region causing said link base resistance to be lower than said intrinsic base resistance.

13. The method of claim 12 further comprising a step of fabricating a diffusion blocking segment on top of said link base region, said diffusion blocking segment preventing diffusion of said dopant spike region out of said link base region.

14. The method of claim 13 further comprising a step of fabricating an emitter on top of said intrinsic base region, said emitter permitting diffusion of said dopant spike region out of said intrinsic base region.

15. The method of claim 12 wherein said dopant spike region comprises boron.

16. The method of claim 12 wherein said dopant spike region comprises boron at a concentration of between $5*10^{18}$ and $1*10^{20}$ atoms per cubic centimeter.

17. The method of claim 12 wherein said link base resistance is approximately 20.0 ohm-microns.

18. The method of claim 12 wherein said base is in a silicon-germanium heterojunction bipolar transistor.

19. The method of claim 12 wherein said base is in an epitaxial base bipolar transistor.

20. A method comprising steps of:

forming a dopant spike region in a link base region of a base, said link base region connecting an intrinsic base region of said base to an extrinsic base region of said base, said link base region having a link base resistance, said intrinsic base region having an intrinsic base resistance;

fabricating a diffusion blocking segment on top of said link base region, said diffusion blocking segment preventing diffusion of said dopant spike region out of said intrinsic base region;

fabricating an emitter on top of said intrinsic base region, said emitter permitting diffusion of said dopant spike region out of said intrinsic base region;

said dopant spike region causing said link base resistance to be lower than said intrinsic base resistance.

21. The method of claim 20 wherein said dopant spike region comprises boron.

22. The method of claim 20 wherein said dopant spike region comprises boron at a concentration of between $5*10^{18}$ and $1*10^{20}$ atoms per cubic centimeter.

23. The method of claim 20 wherein said link base resistance is approximately 20.0 ohm-microns.

24. The method of claim 20 wherein said base is in a silicon-germanium heterojunction bipolar transistor.

25. The method of claim 20 wherein said base is in an epitaxial base bipolar transistor.

* * * * *